United States Patent
Hsu et al.

(10) Patent No.: US 10,522,553 B2
(45) Date of Patent: Dec. 31, 2019

(54) SRAM CELL WITH BALANCED WRITE PORT

(71) Applicant: Taiwan Semiconductor Manufacturing Co., Ltd., Hsin-Chu (TW)

(72) Inventors: Kuo-Hsiu Hsu, Zhongli (TW); Yu-Kuan Lin, Taipei (TW); Feng-Ming Chang, Zhubei (TW); Lien Jung Hung, Taipei (TW); Ping-Wei Wang, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 33 days.

(21) Appl. No.: 16/047,586

(22) Filed: Jul. 27, 2018

(65) Prior Publication Data

US 2018/0366469 A1 Dec. 20, 2018

Related U.S. Application Data

(62) Division of application No. 15/625,490, filed on Jun. 16, 2017, now Pat. No. 10,050,045.

(51) Int. Cl.
*H01L 27/11* (2006.01)
*H01L 27/092* (2006.01)
(Continued)

(52) U.S. Cl.
CPC ........ *H01L 27/1104* (2013.01); *G11C 11/412* (2013.01); *G11C 11/413* (2013.01); *G11C 11/419* (2013.01); *H01L 27/0924* (2013.01)

(58) Field of Classification Search
CPC ..................... H01L 27/11–1116; G11C 11/419
See application file for complete search history.

(56) References Cited

U.S. PATENT DOCUMENTS 6,305,097 B1 10/2001 Salamati-Saradh et al.
6,653,698 B2 11/2003 Lee et al.
(Continued)

FOREIGN PATENT DOCUMENTS

CN 102193337 A 9/2011
CN 103151070 A 5/2013
(Continued)

OTHER PUBLICATIONS

Rahman, Nahid et al., "Design and Verification of Low Power DRAM using 8T SRAM Cell Approach", Apr. 2013, pp. 11-15, vol. 67, Issue No. 18, International Journal of Computer Applications (0975-8887).

*Primary Examiner* — Bryan R Junge
(74) *Attorney, Agent, or Firm* — Haynes and Boone, LLP

(57) ABSTRACT

A semiconductor device includes first, second, third, and fourth active regions arranged along a first direction. The first, second, third, and fourth active regions includes channel regions and source/drain (S/D) regions of first, second, third, and fourth transistors respectively, the first and fourth transistors are of a first conductivity type, and the second and third transistors are of a second conductivity type opposite the first conductivity type. The semiconductor device further includes a fifth active region between the second and third active regions. The fifth active region includes channel regions and S/D regions of fifth and sixth transistors that are of same conductivity type. The semiconductor device further includes first, second, third, fourth, fifth, and sixth gates. The first through sixth gates are disposed over the channel regions of the first through sixth transistors respectively. The first, second, and fifth gates are electrically connected.

20 Claims, 14 Drawing Sheets

(51) Int. Cl.
*G11C 11/419* (2006.01)
*G11C 11/412* (2006.01)
*G11C 11/413* (2006.01)

(56) References Cited

U.S. PATENT DOCUMENTS

| | | |
|---|---|---|
| 7,839,697 B2 | 11/2010 | Ishikura et al. |
| 8,144,540 B2 | 3/2012 | Liaw |
| 8,531,871 B2 | 9/2013 | Chang et al. |
| 9,024,392 B2 | 5/2015 | Liaw |
| 9,257,439 B2 | 2/2016 | Liaw |
| 2003/0006380 A1 | 1/2003 | Van Empel et al. |
| 2003/0185044 A1 | 10/2003 | Nii |
| 2006/0038234 A1 | 2/2006 | Liaw |
| 2007/0211521 A1* | 9/2007 | Kawasumi ............ G11C 11/412 365/154 |
| 2011/0068400 A1 | 3/2011 | Wang et al. |
| 2014/0111782 A1 | 4/2014 | Park et al. |
| 2014/0151811 A1 | 6/2014 | Liaw |
| 2015/0318241 A1 | 11/2015 | Chang et al. |
| 2017/0338233 A1 | 11/2017 | Huang et al. |

FOREIGN PATENT DOCUMENTS

| | | |
|---|---|---|
| DE | 102016117328 | 4/2017 |
| KR | 20160096001 A | 8/2016 |
| TW | 200733355 A | 9/2007 |
| TW | 201112404 A | 4/2011 |
| TW | 201630125 A | 8/2016 |

* cited by examiner

SRAM CELL WITH BALANCED WRITE PORT

PRIORITY

This is a divisional of U.S. patent application Ser. No. 15/625,490, filed Jun. 16, 2017, herein incorporated by reference in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as the scaling down continues, conventional 6T (6-transistor) static random access memory (SRAM) cell suffers from stability problems during read and write operations, where the cell is vulnerable towards noise. To overcome such issue, 8T (8-transistor) SRAM cell designs have been proposed, where write port (write word/bit lines with 6 transistors) are separate from read port (read word/bit lines with 2 transistors). However, existing 8T SRAM cell is not completely satisfactory. For example, the 6 transistors in the write port in conventional 8T SRAM cells are often unbalanced or asymmetrical, which often leads to increased Vccmin (minimum operation voltage). Increased Vccmin leads to increased power consumption and hence is not desirable.

BRIEF DESCRIPTION OF THE DRAWINGS

Aspects of the present disclosure are best understood from the following detailed description when they are read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
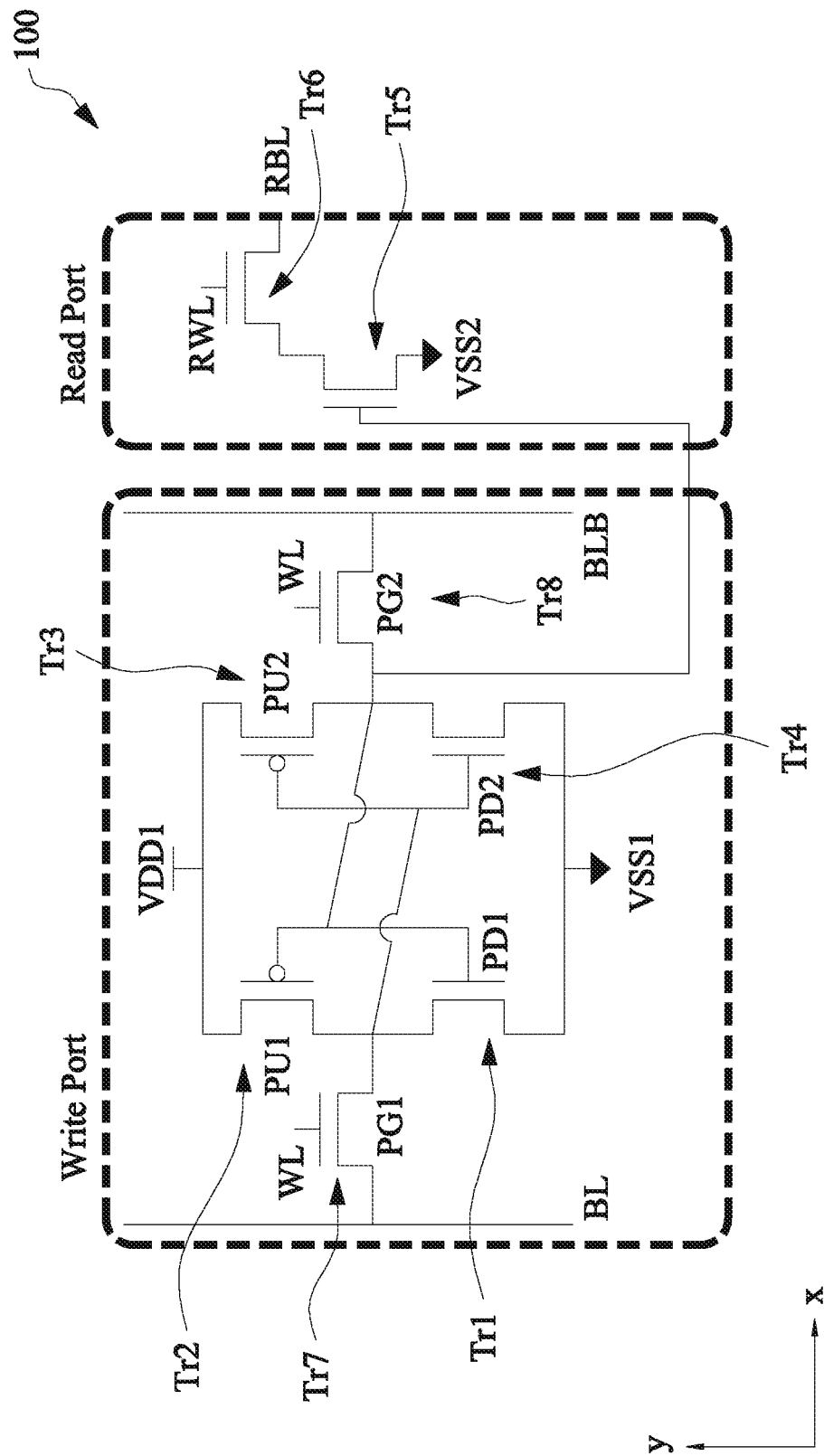
FIG. 1A shows a logic diagram of a SRAM cell, according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present application is generally related to SRAM cell designs, more particularly to 8T SRAM cell designs with a symmetrical write port layout. Features of the present disclosure can be applied to SRAM designs with CMOS (complementary metal-oxide-semiconductor) planar FET (field effect transistor) or multi-gate FET devices including double-gate FET, triple-gate FET, omega-gate FET, and gate-all-around (or surround-gate), and/or FinFET (field effect transistor with fin-like channels).

Figure 1B:
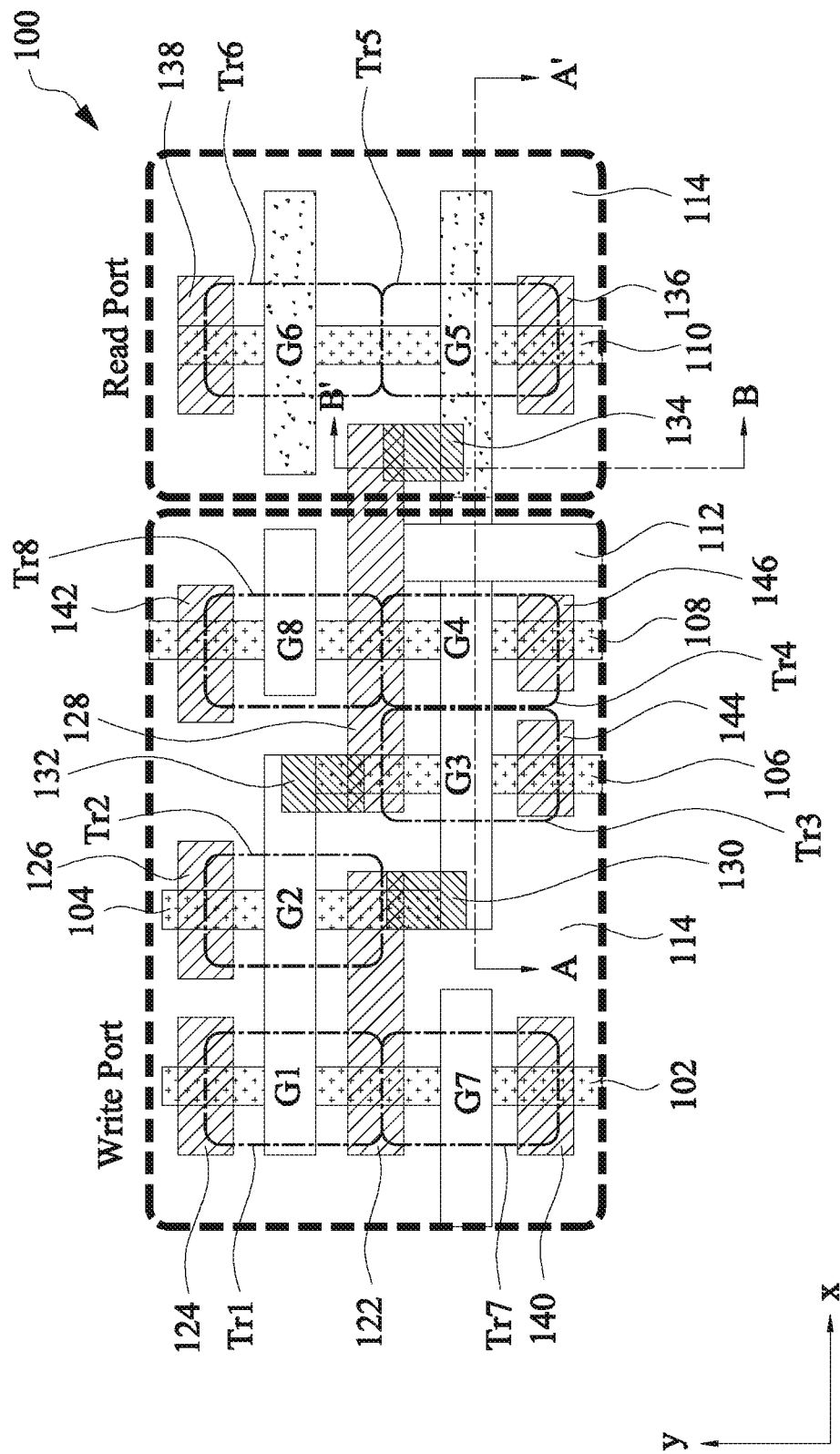
FIG. 1B shows a layout design of and a top view of the SRAM cell of FIG. 1A, in accordance with some embodiments.

FIG. 1A shows a schematic logic diagram of a SRAM cell 100 according to aspects of the present disclosure. FIG. 1B shows a layout (of certain layers) top view of the SRAM cell 100 in an embodiment. Referring to FIG. 1A, the SRAM cell 100 includes a write port and a read port. The write port includes two inverters cross-coupled for storage. The first inverter includes a pull-up transistor PU1 (or Tr2) and a pull-down transistor PD1 (or Tr1) connected in series between high and low potentials, VDD1 and VSS1. The second inverter includes a pull-up transistor PU2 (or Tr3) and a pull-down transistor PD2 (or Tr4) connected in series between the high and low potentials, VDD1 and VSS1. The write port further includes two pass gate transistors PG1 (or Tr7) and PG2 (or Tr8). The gate terminals of PG1 and PG2 are connected to word line WL. One of the two source/drain (S/D) terminals of PG1 is coupled to the gate terminals of PU2 and PD2, and the other one of the two S/D terminals of PG1 is coupled to bit line BL. One of the two source/drain (S/D) terminals of PG2 is coupled to the gate terminals of PU1 and PD1, and the other one of the two S/D terminals of PG2 is coupled to inverse bit line (BLB). The read port includes two transistors Tr5 and Tr6. In the embodiment shown, the gate terminal of Tr5 is coupled to the gate terminals of PU1 and PD1. One of two S/D terminals of Tr5 is coupled to a low potential VSS2 and the other one is coupled to one of two S/D terminals of Tr6. The other S/D terminal of Tr6 is coupled to read bit line RBL. The gate terminal of Tr6 is coupled to read word line RWL. Since the read port is separate from the write port, the 8T SRAM cell 100 has better noise immunity than conventional 6T SRAM cells.

Referring to FIG. 1B, the transistors Tr1 through Tr8 of the SRAM cell 100 are formed over various active regions 102, 104, 106, 108, and 110. Particularly, the active regions 102, 104, 106, 108, and 110 are oriented lengthwise along the "y" direction and are arranged in order from first to fifth along the "x" direction. The transistors Tr1 through Tr8 further includes gates (or gate stacks or gate terminals) G1, G2, G3, G4, G5, G6, G7, and G8, respectively. The active regions 102, 104, 106, 108, and 110 may be in the form of planar active regions, where the respective gate is disposed over a flat surface of the respective active region. Alternatively, the active regions 102, 104, 106, 108, and 110 may be in the form of active fins, where the respective gate is disposed over two or more surfaces of the respective active fin, making the transistors Tr1 through Tr8 FinFETs.

Still referring to FIG. 1B, the active region 102 comprises channel regions and S/D regions of the transistors Tr1 and Tr7. The channel regions of Tr1 and Tr7 are underneath the gates G1 and G7 respectively, and the S/D regions of Tr1 and Tr7 are on opposite sides of the gates G1 and G7 respectively. In the present embodiment, Tr1 and Tr7 share an S/D region that is between the gates G1 and G7. In an alternative embodiment, Tr1 and Tr7 have separate S/D regions.

The active region 104 comprises a channel region and two S/D regions of the transistor Tr2. The channel region of Tr2 is underneath the gate G2, and the S/D regions of Tr2 are on opposite sides of the gate G2. The active region 106 comprises a channel region and two S/D regions of the transistor Tr3. The channel region of Tr3 is underneath the gate G3, and the S/D regions of Tr3 are on opposite sides of the gate G3.

The active region 108 comprises channel regions and S/D regions of the transistors Tr4 and Tr8. The channel regions of Tr4 and Tr8 are underneath the gates G4 and G8, respectively, and the S/D regions of Tr4 and Tr8 are on opposite sides of the gates G4 and G8, respectively. In the present embodiment, Tr4 and Tr8 share an S/D region that is between the gates G4 and G8. In an alternative embodiment, Tr4 and Tr8 have separate S/D regions.

The active region 110 comprises channel regions and S/D regions of the transistors Tr5 and Tr6. The channel regions of Tr5 and Tr6 are underneath the gates G5 and G6, respectively, and the S/D regions of Tr5 and Tr6 are on opposite sides of the gates G5 and G6, respectively. In the present embodiment, Tr5 and Tr6 share an S/D region that is between the gates G5 and G6. In an alternative embodiment, Tr5 and Tr6 have separate S/D regions.

Each of the active regions 102, 104, 106, 108, and 110 comprises one or more semiconductor materials such as silicon, germanium, silicon germanium, silicon carbide, gallium arsenide, indium arsenide, indium phosphide, GaAsP, AlInAs, AlGaAs, InGaAs, GaInP, and/or GaInAsP, or combinations thereof.

The channel regions of the transistors Tr1 through Tr8 may be doped or undoped (including unintentionally doped). The S/D regions of the transistors Tr1 through Tr8 are doped with appropriate materials for the conductivity type of the respective transistor. In an embodiment, the transistors Tr2 and Tr3 are PMOS FETs (p-type conductivity) and the other transistors, Tr1 and Tr4 through Tr8, are NMOS FETs (n-type conductivity). Therefore, the S/D regions of the transistors Tr2 and Tr3 are doped with a p-type material such as boron, and the S/D regions of the other transistors are doped with an n-type material such as phosphorus. The S/D regions of the transistors Tr1 through Tr8 may comprise epitaxially grown semiconductor material, such as epitaxially grown silicon for the NMOS FETs or epitaxially grown silicon germanium for the PMOS FETs.

The gates G1, G2, G3, G4, G5, G6, G7, and G8 are oriented lengthwise along the "x" direction. In the present embodiment, the gates G1, G2, G8, and G6 are aligned on a straight line; and the gates G7, G3, G4, and the G5 are aligned on another straight line. Each of the gates G1 through G8 includes a gate dielectric layer and a gate electrode layer over the gate dielectric layer. In some embodiments, each of the gates G1 through G8 may further include an interfacial layer between the gate dielectric layer and the underlying channel semiconductor material. The gate electrode layer in the gates G1 through G8 may include one or more work function layers and a metal fill (or bulk metal) layer. The gates G1 and G2 are electrically connected, for example, by sharing a common metal layer in the respective gates in the embodiment shown or by upper level metal interconnects in an alternative embodiment. The gates G3 and G4 are electrically connected, for example, by sharing a common metal layer in the respective gates in the embodiment shown or by upper level metal interconnects in an alternative embodiment.

The SRAM cell 100 further includes various contact (or S/D contact) features 122, 124, 126, 128, 136, 138, 140, 142, 144, and 146 disposed over the S/D regions of the transistors Tr1 through Tr8. The contact 122 is disposed over the shared S/D region of Tr1 and Tr7. The contacts 124 and 140 are disposed over the other S/D regions of Tr1 and Tr7 respectively. The contact 124 serves as one VSS1 terminal. The contact 140 serves as the BL terminal. The contact 122 is also disposed over an S/D region of the transistor Tr2 to electrically couple the S/D regions of Tr1, Tr2, and Tr7. The contact 126 is disposed over another S/D region of Tr2 and serves as one VDD1 terminal.

The contact 128 is disposed over the shared S/D region of Tr4 and Tr8. The contacts 146 and 142 are disposed over the other S/D regions of Tr4 and Tr8 respectively. The contact 142 serves as the BLB terminal. The contact 146 serves as one VSS1 terminal. The contact 128 is also disposed over an S/D region of Tr3 to electrically couple the S/D regions of Tr3, Tr4, and Tr8. The contact 144 is disposed over another S/D region of Tr3 and serves as one VDD1 terminal.

The contact 136 is disposed over an S/D region of Tr5 and serves as the VSS2 terminal. The contact 138 is disposed over an S/D region of Tr6 and serves as the RBL terminal.

The SRAM cell 100 further includes various conductive features 130, 132, and 134. The conductive feature 130 electrically connects the S/D contact 122 and the gate G3. The conductive feature 132 electrically connects the S/D contact 128 and the gate G2. The conductive feature 134 electrically connects the S/D contact 128 and the gate G5. The conductive features 130, 132, and 134 may include one or more elemental metals, metal alloy, conductive metal oxide, conductive metal nitride, or other suitable conductive materials. Effectively, the S/D regions of the transistors Tr1, Tr2, and Tr7 and the gates G3 and G4 are electrically connected; and the gates G1, G2, and G5 and the S/D regions of the transistors Tr3, Tr4, and Tr8 are electrically connected.

The SRAM cell 100 further includes one or more insulating materials 112 and 114 to electrically isolate various components. Particularly, the insulating material 112 is disposed between the gates G4 and G5 to electrically isolate the two. The insulating materials 112 and 114 may include silicon oxide, silicon nitride, silicon oxynitride, a low-k dielectric material, or other suitable dielectric material(s). The insulating material 112 and the insulating material 114 may comprise the same or different dielectric materials.

In various embodiments, the transistors in the read port (Tr5 and Tr6) and the transistors in the write port (Tr1 through Tr4, Tr7, and Tr8) are designed to have different threshold voltages (Vt). For example, the transistors Tr1 through Tr4 may be designed to have standard Vt while the transistors Tr5 and Tr6 are designed to have low Vt or ultra-low Vt (lower than the standard Vt) to speed up the read operations. Many factors affect the threshold voltage of a transistor, one of which is the work function of the gate of the transistor. Oftentimes, a gate can be designed with appropriate work function layer(s) to provide appropriate threshold voltage of the transistor. For example, even though transistors Tr4 and Tr5 are both NMOS FETs in some embodiment, the gate G5 may be designed to have a different work function than the gate G4.

In some SRAM cell designs, the gates G4 and G5 are connected by sharing a common metal layer in their gate stacks (in these embodiments, the gate G5 is not connected to the contact 128). This might cause unbalance between the transistors Tr1 and Tr4, both of which are NMOS FETs, for the following two reasons. First, the gate G1 has an end cap to the left of the active region 102 while the gate G4 extends all the way to the active region 110. Here, an "end cap" refers to the extension of a gate beyond the width of the active region (e.g., extension along the "x" direction in FIG. 1B). A shorter end cap in the gate G1 typically causes an increase in the work function thereof. Second, the gates G4 and G5 may have different gate stacks, such as different work function metal layers. When the gates G4 and G5 share a common metal layer, the metal elements of the two gate stacks may intermix to affect the work function of each gate. Particularly, when the gate G5 has a lower work function, metal elements of the gate G5 migrating into the gate G4 would tend to reduce the work function of the gate G4. Either or both reasons above would result in a higher threshold voltage in the transistor Tr1 than the transistor Tr4, which ideally should match each other. Consequently, the transistor Tr4 in those 8T SRAM cells needs a higher Vccmin to operate reliably, thereby increasing the overall Vccmin of the 8T SRAM cell. In contrast, the SRAM cell 100 of the present embodiment has the gates G4 and G5 electrically isolated to overcome the unbalance issue discussed above.

Referring to FIG. 1B, the insulating material 112 electrically isolates the gates G4 and G5. The end cap of the gate G4 to the right of the active region 108 can be adjusted to be equal to, shorter than, or longer than the end cap of the gate G1 to the left of the active region 102. This provides the flexibility of making the two gates G1 and G4 (and in turn, the transistors Tr1 and Tr4) to match each other. Furthermore, the insulating material 112 prevents the metal elements of the gates G4 and G5 from intermixing.

Figure 1C:
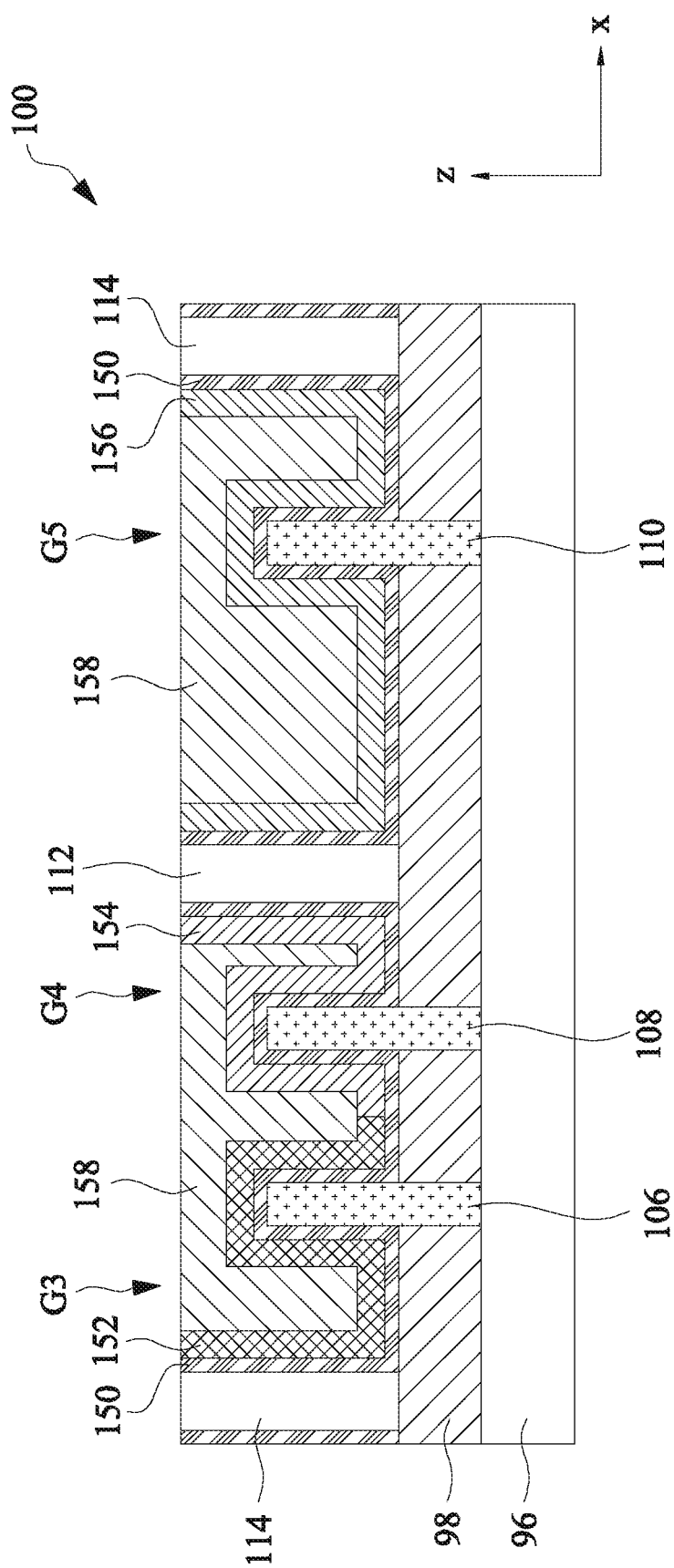
FIG. 1C illustrates a cross-sectional view of the SRAM cell of FIG. 1B along the A-A' line of FIG. 1B, in accordance with an embodiment.
Figure 1D:
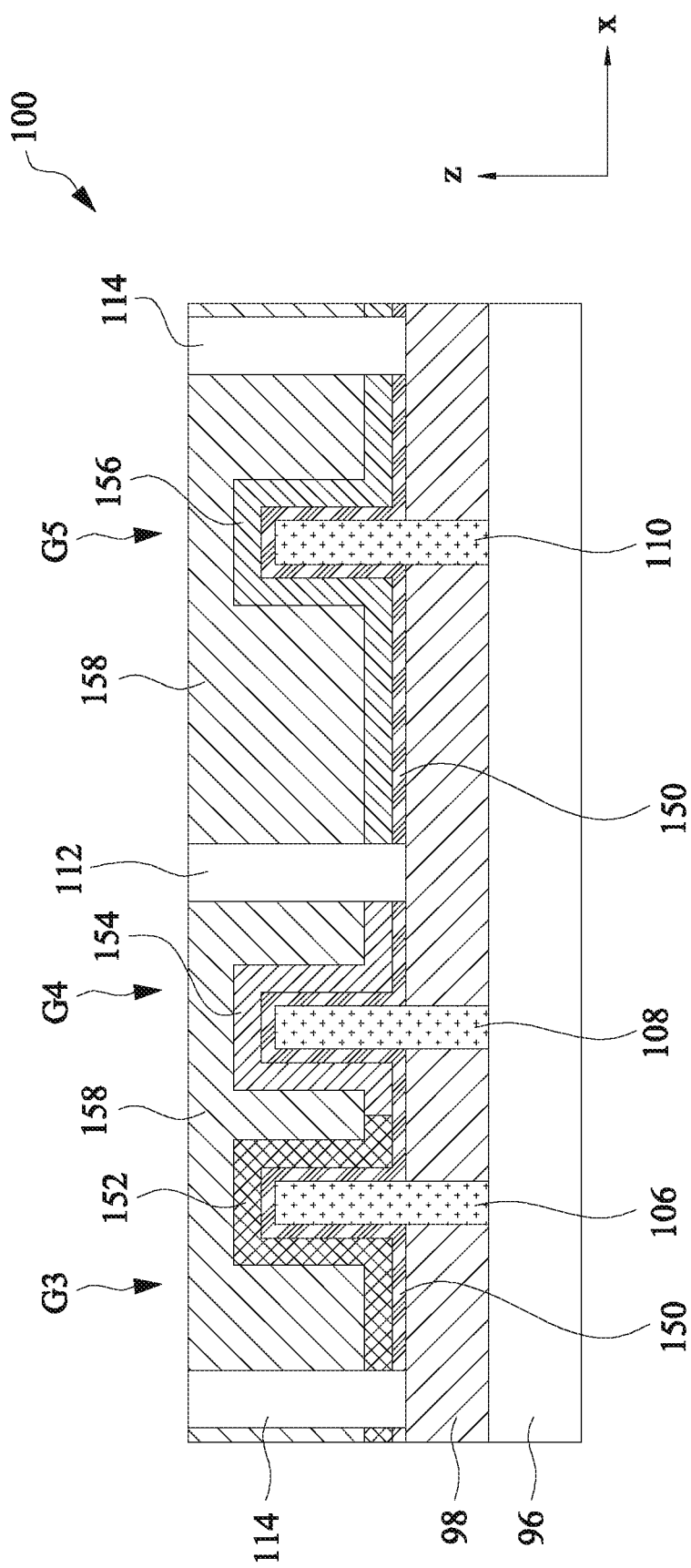
FIG. 1D illustrates a cross-sectional view of the SRAM cell of FIG. 1B along the A-A' line of FIG. 1B, in accordance with another embodiment.

There are multiple ways of isolating the gates G4 and G5. One way is to define the gates G4 and G5 as separate gates during mask making and photolithography. FIG. 1C illustrates a structure of the gates G4 and G5 formed by this method, in accordance with one embodiment. Another way is to form a common gate and then cut the common gate into separate gates G4 and G5. FIG. 1D illustrates the structure of the gates G4 and G5 formed by this cut-gate method, in accordance with one embodiment. Various other embodiments of forming the gates G4 and G5 are contemplated to be within the scope of the present disclosure. Each of the FIGS. 1C and 1D is a cross-sectional view of the SRAM cell 100 taken along the A-A' line of FIG. 1B.

Referring to FIG. 1C, in this embodiment, the active regions including 106, 108, and 110 have fin-like structures (fins), making the transistors Tr1 through Tr8 FinFETs. The fins 106, 108, and 110 extend upwardly from a substrate 96 and are isolated from each other by an isolation structure 98. The substrate 96 is a silicon substrate in the present embodiment. Alternatively, the substrate 96 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The isolation structure 98 may be formed of silicon oxide, silicon nitride, silicon oxynitride, fluoride-doped silicate glass (FSG), a low-k dielectric material, and/or other suitable insulating material. The isolation structure 98 may be shallow trench isolation (STI) features. In an embodiment, the isolation structures 98 is formed by etching trenches in the substrate 96, e.g., as part of the fin formation process. The trenches may then be filled with isolating material, followed by a chemical mechanical planarization (CMP) process. Other isolation structure such as field oxide, LOCal Oxidation of Silicon (LOCOS), and/or other suitable structures are possible. The isolation structure 98 may include a multi-layer structure, for example, having one or more thermal oxide liner layers.

Still referring to FIG. 1C, the gates G3, G4, and G5 are disposed over the fins 106, 108, and 110 respectively. The gate G3 includes a gate dielectric layer 150, one or more work function layer 152, and a metal fill layer 158. The gate G4 includes the gate dielectric layer 150, one or more work function layer 154, and the metal fill layer 158. The gate G5 includes the gate dielectric layer 150, one or more work function layer 154, and the metal fill layer 158. Although not shown, there may be an interfacial layer under the gate dielectric layer 150. The interfacial layer may include a dielectric material such as silicon oxide layer ($SiO_2$) or silicon oxynitride (SiON), and may be formed by chemical oxidation, thermal oxidation, atomic layer deposition (ALD), CVD, and/or other suitable dielectric. The gate dielectric layer 150 may include a high-k dielectric layer such as hafnium oxide ($HfO_2$), zirconium oxide ($ZrO_2$), lanthanum oxide ($La_2O_3$), titanium oxide ($TiO_2$), yttrium oxide ($Y_2O_3$), strontium titanate ($SrTiO_3$), other suitable metal-oxides, or combinations thereof. The gate dielectric layer 150 may be formed by ALD and/or other suitable methods. The work function layers 152, 154, and 156 may be a p-type or an n-type work function layer depending on the respective transistor's conductivity type. The p-type work function layer comprises a metal with a sufficiently large effective work function, selected from but not limited to the group of titanium nitride (TiN), tantalum nitride (TaN), ruthenium (Ru), molybdenum (Mo), tungsten (W), platinum (Pt), or combinations thereof. The n-type work function layer comprises a metal with sufficiently low effective work function, selected from but not limited to the group of titanium (Ti), aluminum (Al), tantalum carbide (TaC), tantalum carbide nitride (TaCN), tantalum silicon nitride (TaSiN), or combinations thereof. The work function layer 150 may include a plurality of layers and may be deposited by CVD, PVD, and/or other suitable process. The metal fill layer 158 may include aluminum (Al), tungsten (W), cobalt (Co), copper (Cu), and/or other suitable materials. The metal fill layer 158 may be formed by CVD, PVD, plating, and/or other suitable processes. The gate electrode in each of the gates G3, G4, and G5 includes the respective work function layer (152, 154, or 156) and the metal fill layer 158. In the present embodiment, the gates G3 and G4 are electrically connected by the common metal fill layer 158.

In an embodiment, the gates G3/G4 and G5 are defined as separate gates during photolithography which includes multiple deposition and etching processes to form two separate trenches in place of the gates G3/G4 and G5. The trenches are surrounded by the insulating materials 112 and 114 on their sidewalls. Subsequently, the various layers 150, 152/154/156, and 158 are deposited into the two trenches to form the gates G3, G4 and G5. Particularly, the gate dielectric layer 150 is deposited onto sidewalls of the two trenches.

Referring to FIG. 1D, in this embodiment, the gates G3/G4 and G5 are initially connected during their formation process. Then, a cut process is performed to separate the gate G5 from the gates G3/G4, and results in a trench between the gates G4 and G5. Subsequently, the insulating material 112 is deposited to fill in the trench. As a result, the gate dielectric layer 150 is deposited onto the fins 106/108/110 and the isolation structure 98 but not onto the upper portion of the insulating material 112.

Referring back to FIG. 1B, the connectivity between the read port and the write port of the SRAM cell 100 in the present embodiment is achieved by connecting the gate G5 to the S/D contact 128. Particularly, the S/D contact 128 extends into the region for the read port between the gates G5 and G6. Then, the conductive feature 134 electrically connects the S/D contact 128 to the gate G5. The conductive feature 134 may include one or more layers of conductive materials. FIGS. 1E, 1F, 1G, and 1H show four different embodiments of the conductive feature 134. Each of the FIGS. 1E, 1F, 1G, and 1H is a cross-sectional view of the SRAM cell 100 taken along the B-B' line of FIG. 1B. Various other embodiments of electrically connecting the S/D contact 128 to the gate G5 are contemplated to be within the scope of the present disclosure.

Figure 1E:
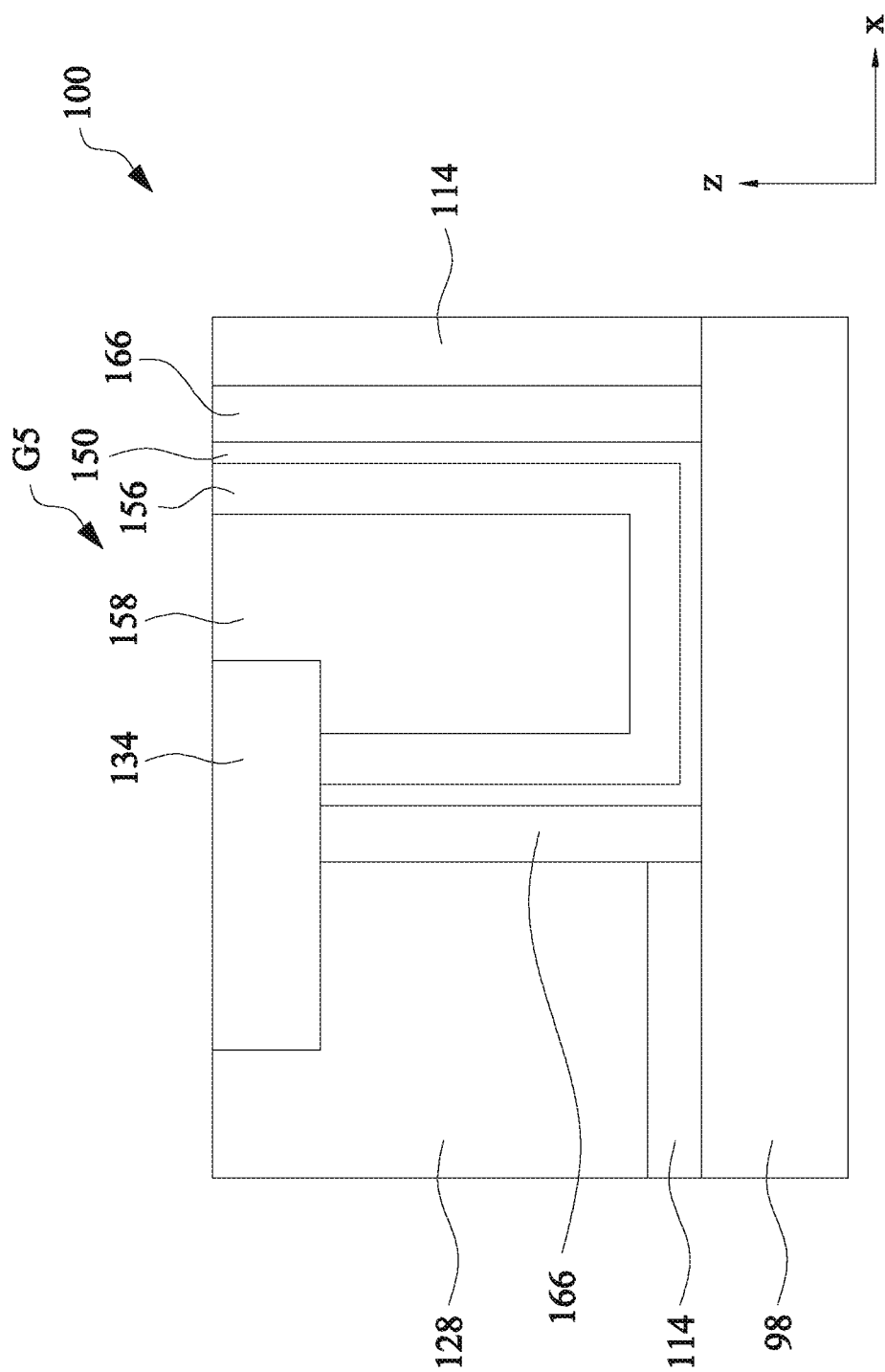
FIG. 1E illustrates a cross-sectional view of the SRAM cell of FIG. 1B along the B-B' line of FIG. 1B, in accordance with an embodiment.

Referring to FIG. 1E, in this embodiment, the conductive feature 134 is electrically connected to the upper portion of the gate G5, but not the lower portion of the gate G5. In an embodiment, the conductive feature 134 may be formed as part of a butted (or shared) contact. For example, after the gates G1-G8 are formed in trenches surrounded by a dielectric gate spacer 166 which is in turn surrounded by the insulating material 114, one or more etching processes are performed to etch trenches into the insulating material 114 to expose the S/D regions of the transistors Tr1-Tr8. As part of these etching processes, an upper and side portion of the gate G5 is also exposed. Particularly, part of the gate electrode including the work function layer 156 and the metal fill layer 158 is exposed. Subsequently, one or more conductive materials are filled into the trenches to form the S/D contacts including the S/D contact 128. The conductive feature 134 is thereby formed as part of the S/D contact 128 in this process. The S/D contact 128 (and the conductive feature 134) may include a conductive barrier layer (such as TiN or TaN) and a metal layer over the conductive barrier layer. The metal layer may include aluminum (Al), copper (Cu), tungsten (W), or other suitable material.

Figure 1F:
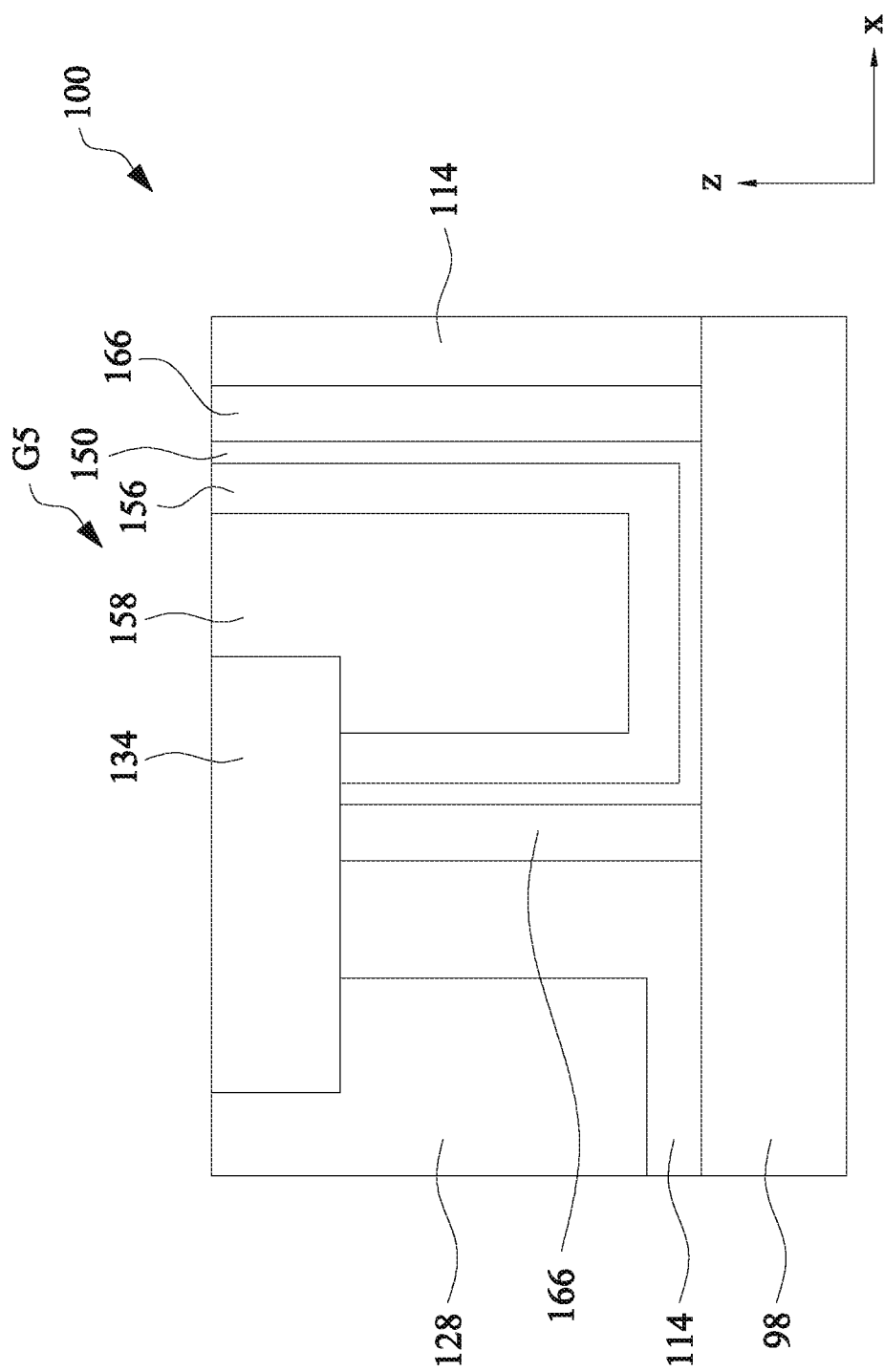
FIG. 1F illustrates a cross-sectional view of the SRAM cell of FIG. 1B along the B-B' line of FIG. 1B, in accordance with another embodiment.

Referring to FIG. 1F, in this embodiment, the conductive feature 134 is electrically connected to the upper portion of the gate G5, but not the lower portion of the gate G5. In an embodiment, the conductive feature 134 may be formed as a butted (or shared) contact as discussed with respect to FIG. 1E. To further this embodiment, the etching processes do not completely remove the insulating material 114 between the S/D contact 128 and the gate spacer 166. In another embodiment, the S/D contact 128 and the conductive feature 134 may be formed in different processes. For example, after the gate G5 and the S/D contact 128 have been formed, an etching process is performed to form a trench between the gate G5 and the S/D contact 128, and to further expose a side portion of the S/D contact 128 and a side portion of the gate electrode of the gate G5. Then, one or more conductive materials are deposited into the trench to form the conductive feature 134, which may include a conductive barrier layer (such as TiN or TaN) and a metal layer (such as Al, Cu, or W) over the conductive barrier layer.

Figure 1G:
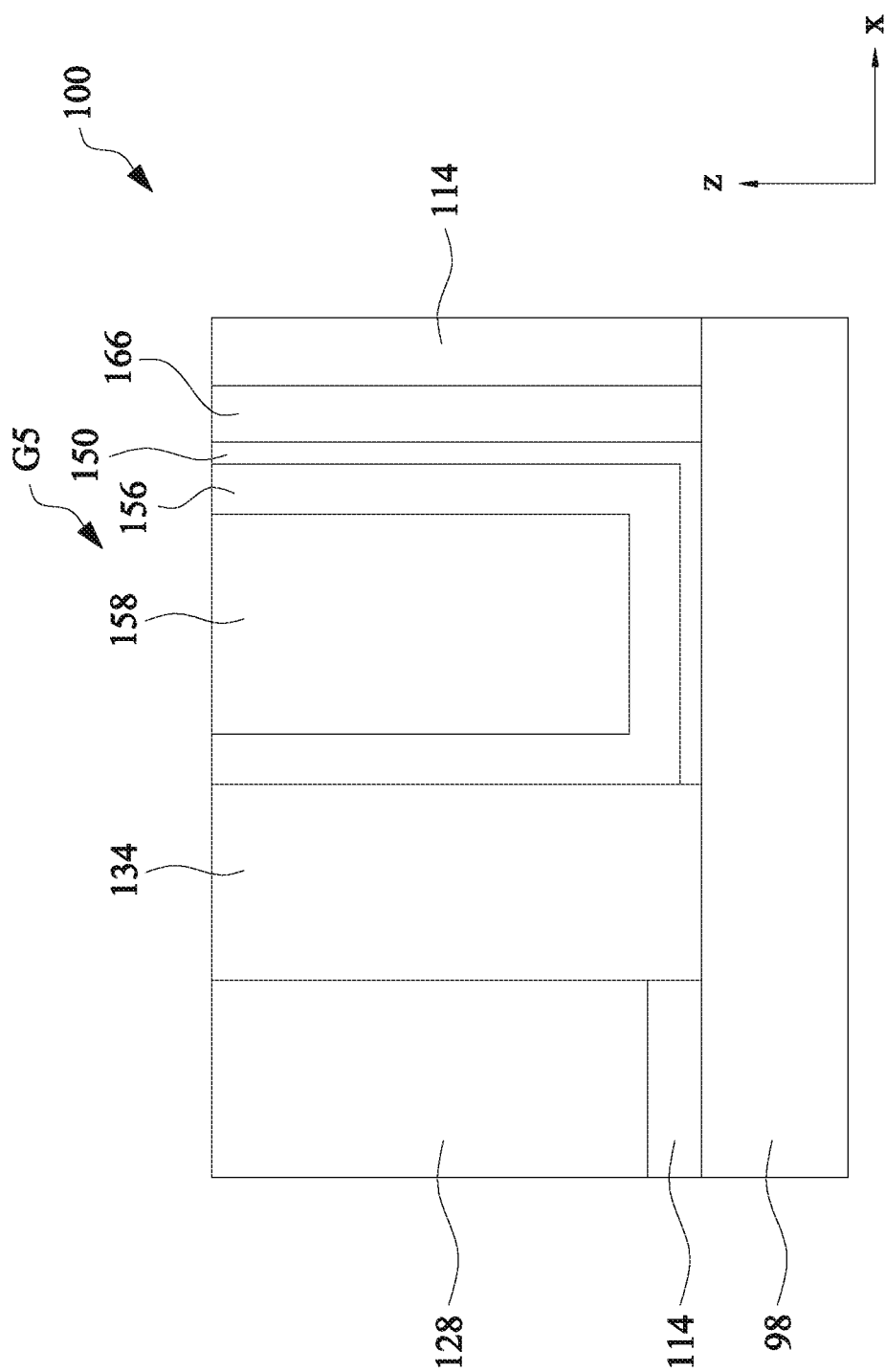
FIG. 1G illustrates a cross-sectional view of the SRAM cell of FIG. 1B along the B-B' line of FIG. 1B, in accordance with yet another embodiment.

Referring to FIG. 1G, in this embodiment, the conductive feature 134 is electrically connected to a side portion of the gate electrode of the gate G5 and a sidewall of the S/D contact 128. Particularly, the conductive feature 134 is connected to both the upper and lower portions of the sidewall of the gate electrode of the gate G5. In an exemplary formation process, after the gate G5 and the S/D contact 128 have been formed, an etching process is performed to form a trench between the gate G5 and the S/D contact 128. In an embodiment, the etching process is tuned to selectively remove the insulating material 114 and the gate dielectric layer 150 but not the S/D contact 128 and the gate electrode 156/158. The etching process exposes a side portion of the S/D contact 128 and a sidewall of the gate electrode of the gate G5. Particularly, the etching process fully exposes the sidewall of the work function layer 156 of the gate G5. Then, one or more conductive materials are deposited into the trench to form the conductive feature 134, which may include a conductive barrier layer (such as TiN or TaN) and a metal layer (such as Al, Cu, or W) over the conductive barrier layer.

Figure 1H:
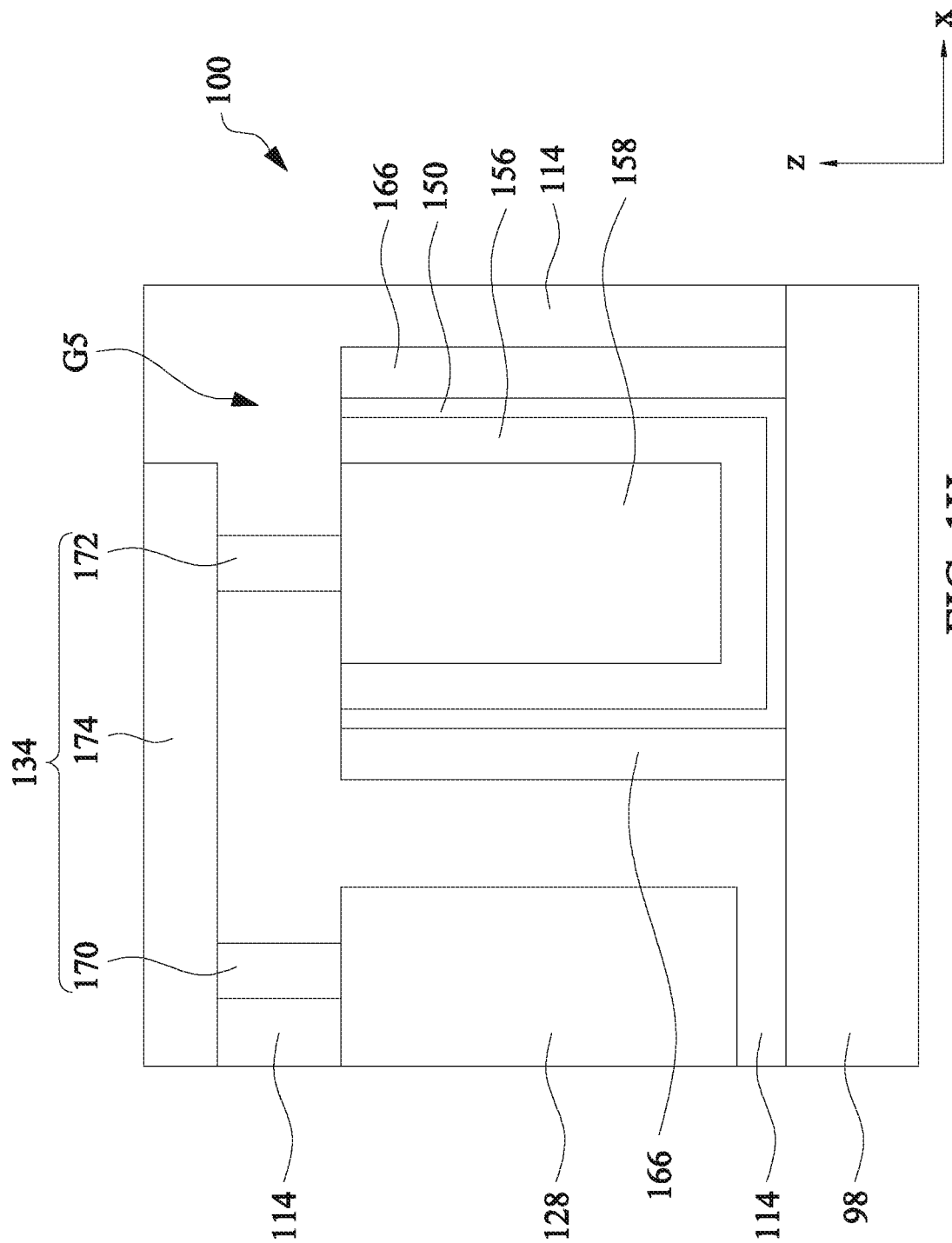
FIG. 1H illustrates a cross-sectional view of the SRAM cell of FIG. 1B along the B-B' line of FIG. 1B, in accordance with an embodiment.

Referring to FIG. 1H, in this embodiment, the conductive feature 134 includes conductive plugs (or vias) 170 and 172 and a conductive wire 174. The plugs 170 and 172 are disposed over the S/D contact 128 and the gate G5 respectively. The wire 174 electrically connects the plugs 170 and 172. Each of the plugs 170 and 172 may comprise one or more conductive barrier layers (such as TiN or TaN) and a metal layer (such as Al, Cu, or W). The wire 174 may comprise one or more conductive barrier layers (such as TiN or TaN) and a metal layer (such as Al, Cu, or W). The plugs 170 and 172 may be formed by etching holes into the insulating material 114 above the S/D contact 128 and the gate G5, and then filling the holes with one or more conductive materials. The wire 174 may be formed by etching a trench in the insulating material 114, and filling the trench with one or more conductive materials. The plugs 170/172 and the wire 174 may be formed by single damascene processes, dual damascene processes, or other suitable processes.

Figure 2A:
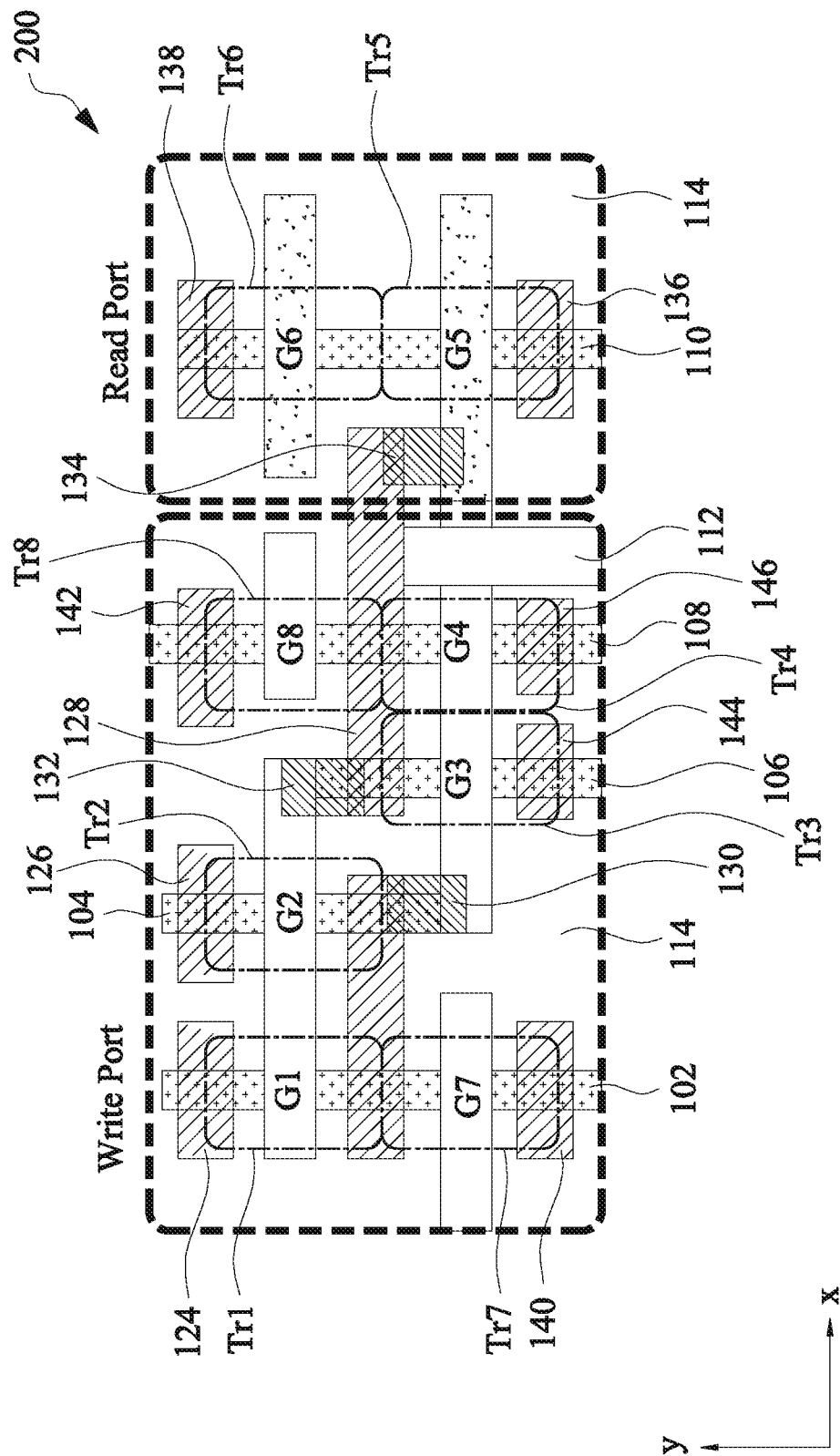
FIG. 2A shows a layout design of and a top view of another SRAM cell, according to various aspects of the present disclosure.
Figure 2B:
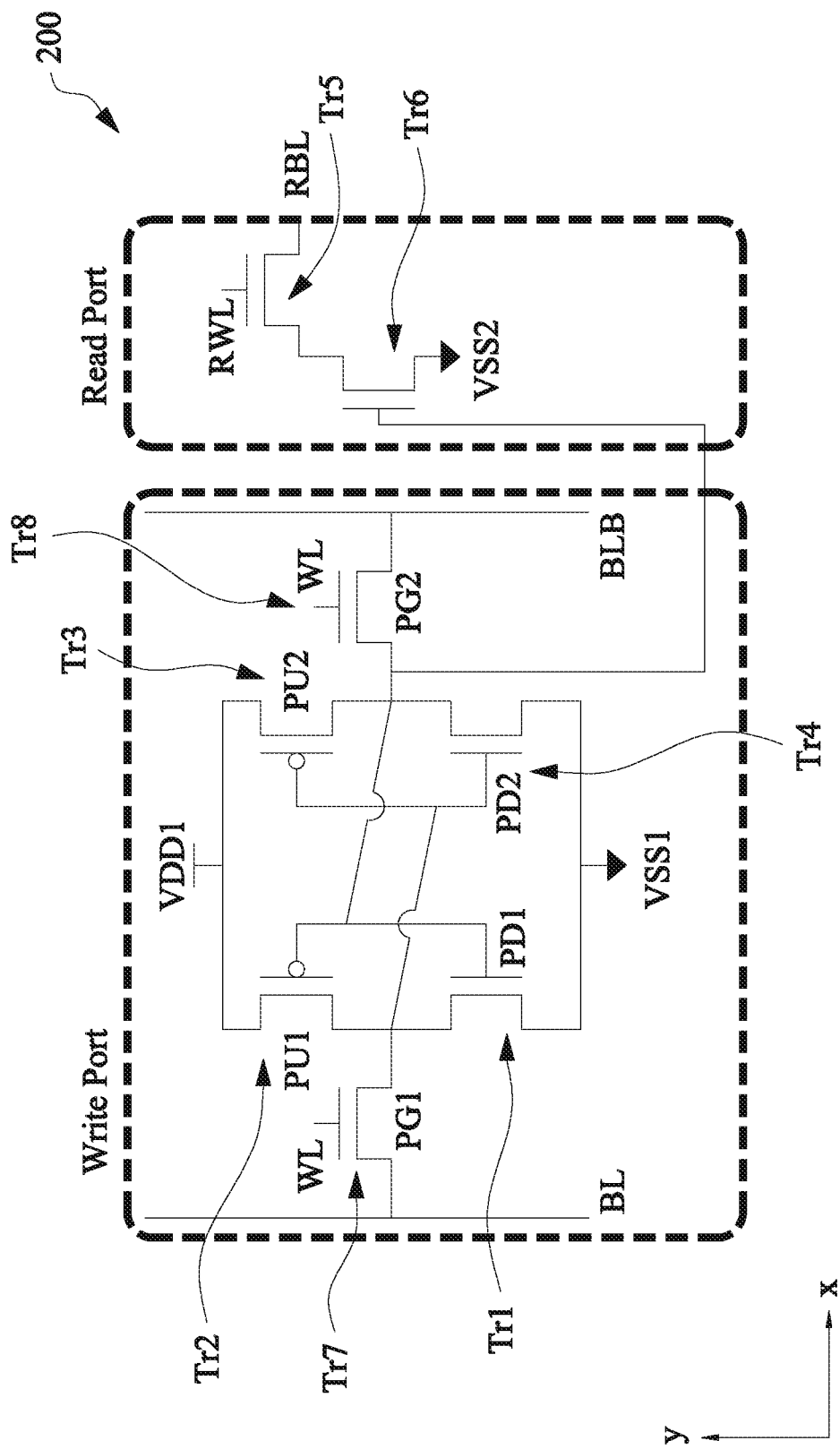
FIG. 2B shows the logic diagram of the SRAM cell of FIG. 2A in an embodiment.

FIG. 2A illustrates a top view of an SRAM cell 200 in an embodiment. FIG. 2B shows the logic diagram of the SRAM cell 200 in an embodiment. The SRAM cell 200 is essentially the same as the SRAM cell 100 shown in FIG. 1B, except that the read port transistors are flipped in terms of their functions. Referring to FIG. 2A, the S/D contact 128 is electrically connected to the gate G6 in the SRAM cell 200 instead of the gate G5 in the SRAM cell 100. In the SRAM cell 200, the S/D contact 136 serves as the RBL terminal and the S/D contact 138 serves as the VSS2 terminal. The conductive feature 134 may take the form of any of the embodiments shown in FIGS. 1E-1H, or may take other forms. Other aspects of the SRAM cell 200 are the same as the SRAM cell 100. Looking at the SRAM cells 100 and 200 from a different perspective, the SRAM cell 200 is the same as the SRAM cell 100 with the transistor Tr5 placed above (along the "y" direction) the transistor Tr6.

Figure 3A:
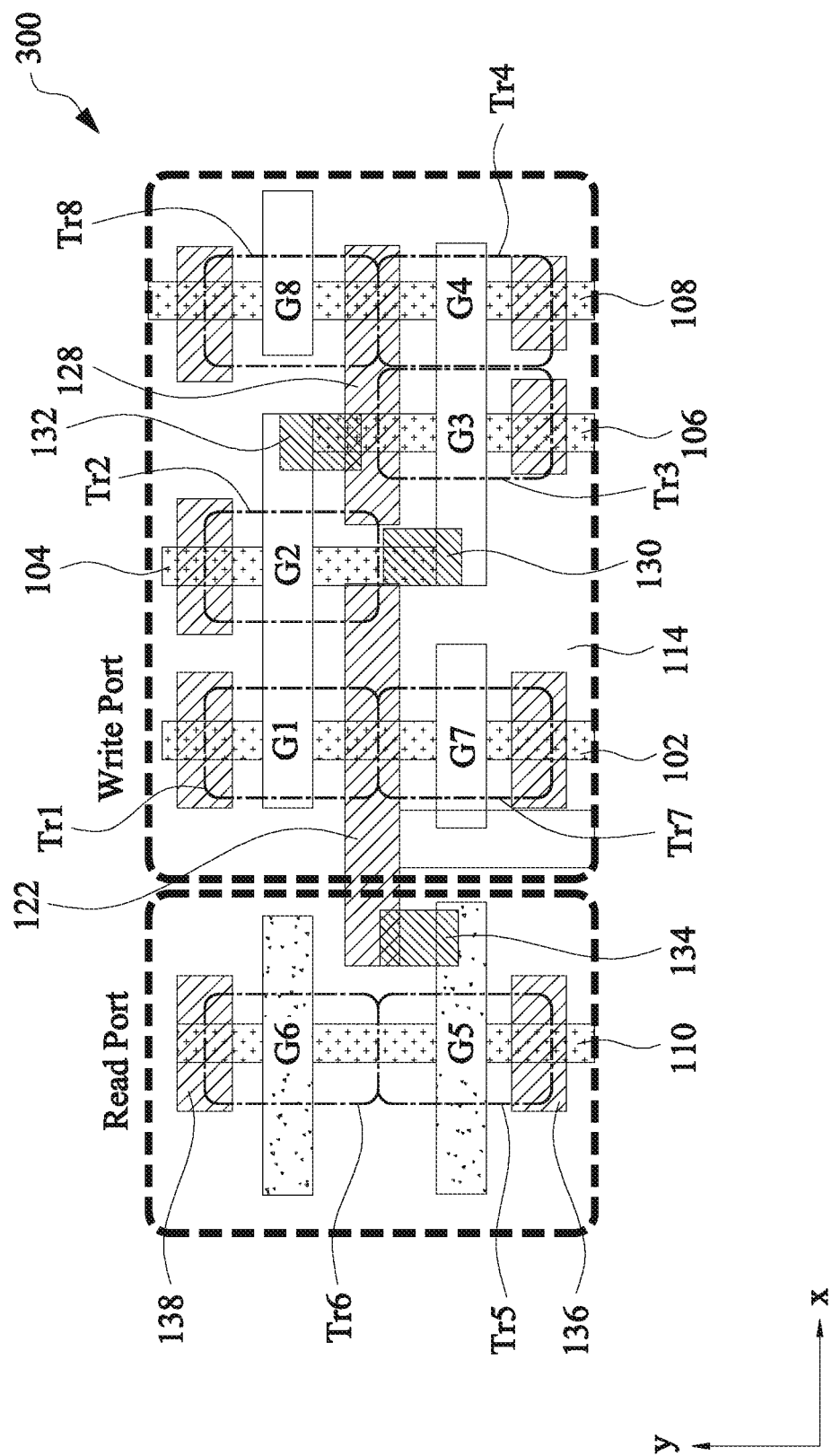
FIG. 3A shows a layout design of and a top view of yet another SRAM cell, according to various aspects of the present disclosure.
Figure 3B:
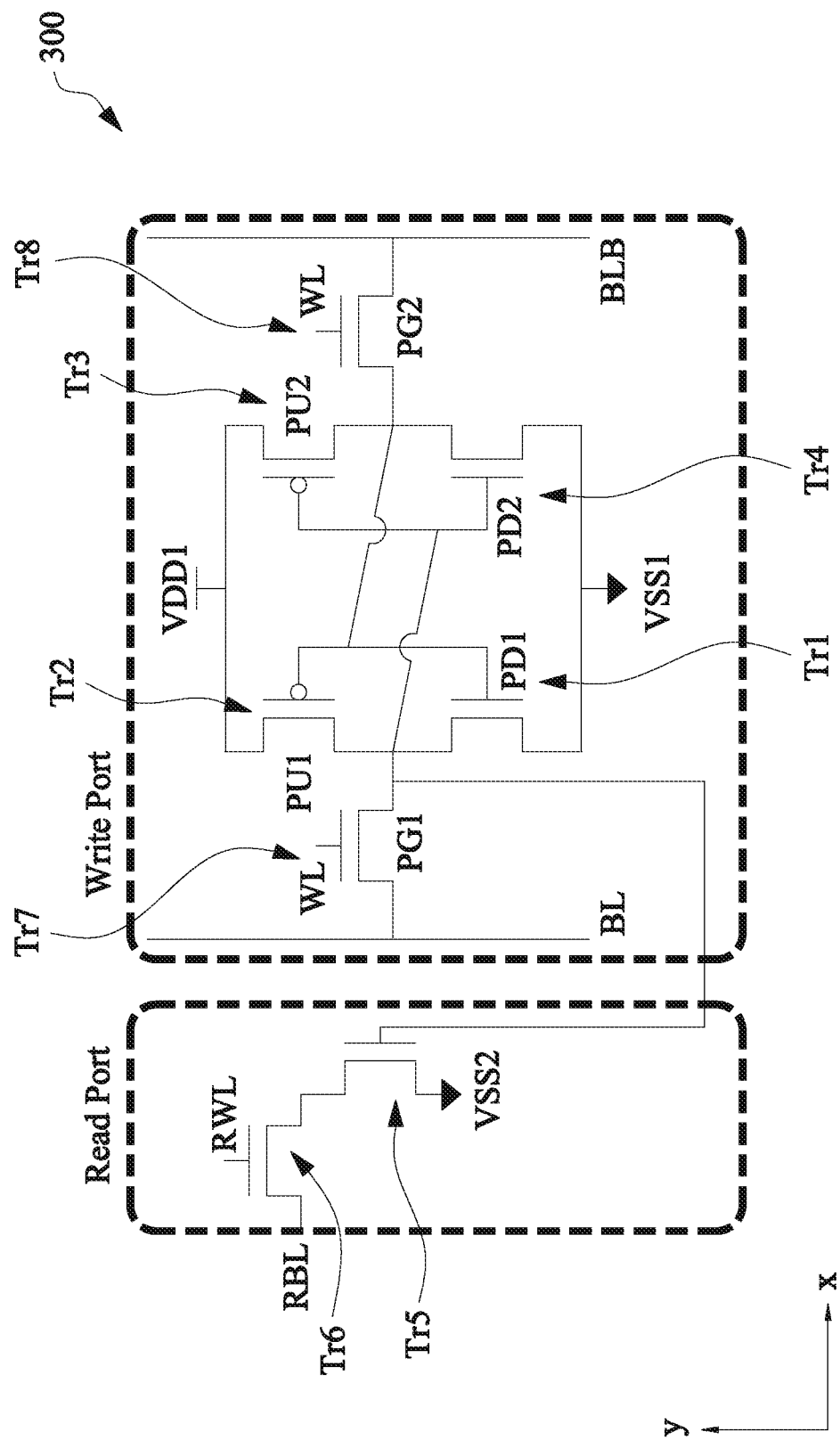
FIG. 3B shows the logic diagram of the SRAM cell of FIG. 3A in an embodiment.

FIG. 3A illustrates a top view of an SRAM cell 300 in an embodiment. FIG. 3B shows the logic diagram of the SRAM cell 300 in one embodiment. The SRAM cell 300 is essentially the same as the SRAM cell 100 shown in FIG. 1B, except that the read port is placed on the left side of the write port and the gate G5 is connected to the S/D contact 122 in the SRAM cell 300 rather than the S/D contact 128 as in SRAM cell 100. Referring to FIG. 3A, the S/D contact 122 extends into the region for the read port and between the gates G5 and G6. The conductive feature 134 electrically connects the S/D contact 122 to the gate G5. The conductive feature 134 may take the form of any of the embodiments shown in FIGS. 1E-1H, or may take other forms. Other aspects of the SRAM cell 200 and the same as the SRAM cell 100.

Figure 4A:
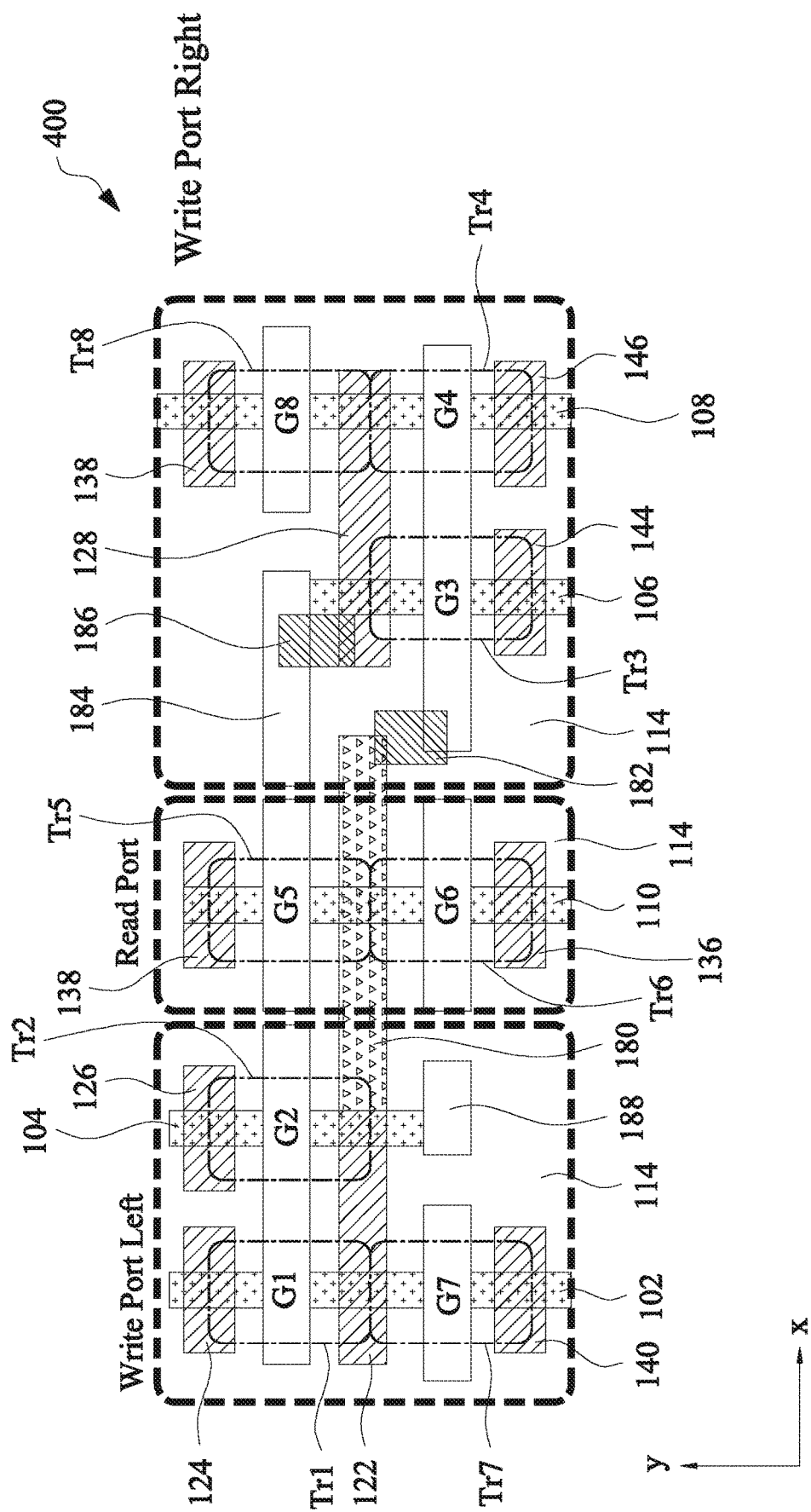
FIG. 4A shows a layout design of and a top view of an SRAM cell, according to various aspects of the present disclosure.

FIG. 4A shows a top view of an SRAM cell 400 constructed according to aspects of the present disclosure. The SRAM cell 400 also comprises the transistors Tr1 through Tr8, but the placement of the transistors is different from that of the SRAM cell 100. Particularly, the write port in the SRAM cell 400 is split into a left portion (write port left) and a right portion (write port right). The left portion comprises the transistors Tr1, Tr2, and Tr7. The right portion comprises the transistors Tr3, Tr4, and Tr8. The read port is placed between the left and right portions of the write port. Both the gates G1 and G4 have an end cap, and can be designed and manufactured to allow the transistors Tr1 and Tr4 to match each other. Similar to the SRAM cells 100, 200, and 300, the SRAM cell 400 also provides benefits of balanced transistors in the write port and reduced Vccmin. Many aspects of the SRAM cell 400 are the same as those of the SRAM cell 100. Some differences are discussed below.

The S/D contact 122 is electrically connected to the gate G3 through conductive features 180 and 182. Particularly the conductive feature 180 is routed above the active region 110 without electrically contacting the S/D regions of the transistors Tr5 and Tr6. The gates G1, G2, G5 are electrically connected, for example by sharing a common metal layer in the respective gates. The gate G5 further extends into the right portion of the write port. The extension of the gate G5 is referred to as the conductive feature 184. The conductive feature 184 is electrically connected to the S/D contact 128 through a conductive feature 186. The conductive feature 186 may be similar to the conductive feature 134 in various embodiments. In the embodiment shown in FIG. 4A, the SRAM cell 400 includes a remnant gate feature 188 which is a residue after some cut-gate process that separates the gates G7, G6, and G3/G4.

Figure 4B:
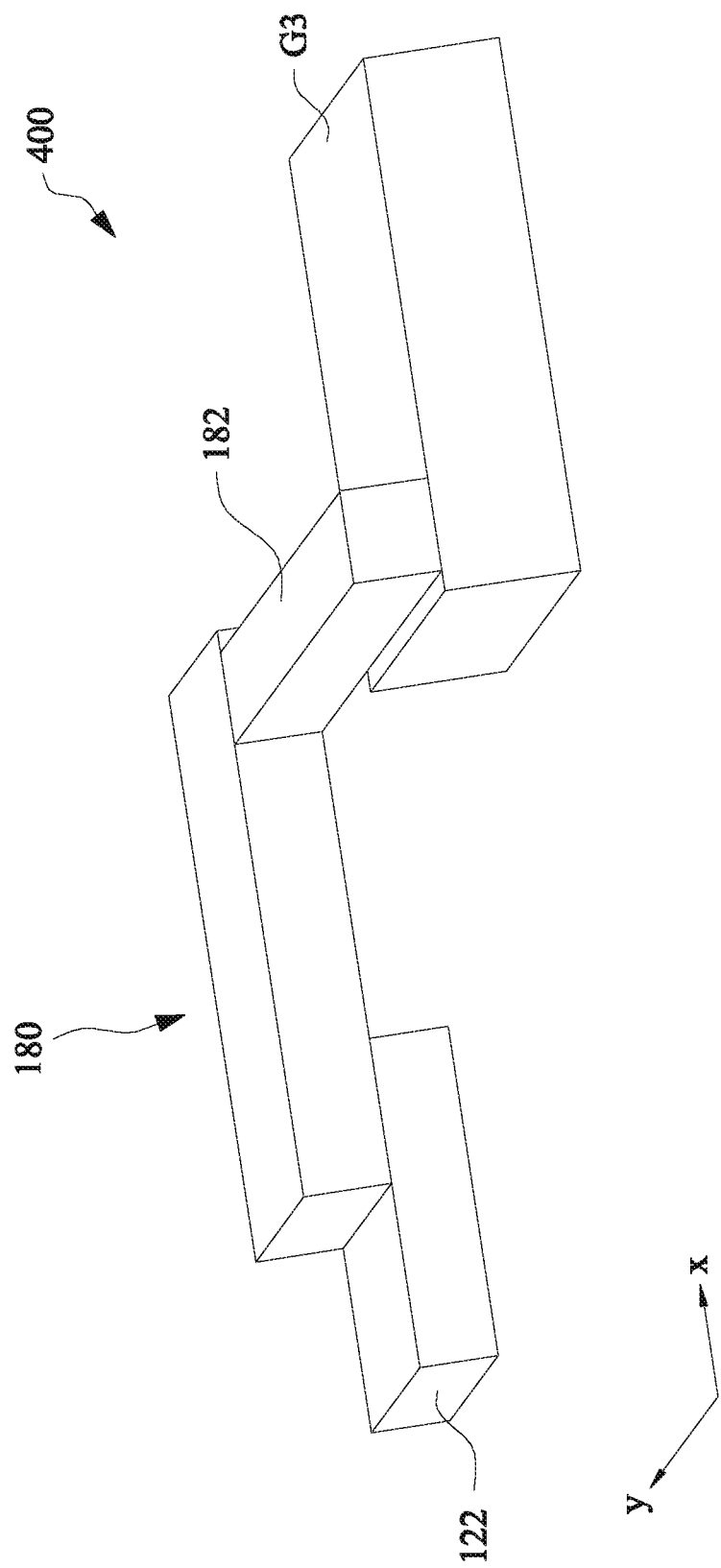
FIG. 4B illustrates a perspective view of some connectivity of the SRAM cell of FIG. 4A, in accordance with some embodiment.

FIG. 4B illustrates the conductive features 180 and 182 according to an embodiment. Referring to FIG. 4B, the conductive features 180 and 182 are in the form of local interconnection. The conductive feature 180 is disposed over the S/D contact 122, the conductive feature 182 is disposed over the gate G3, and the conductive features 180 and 182 are directly connected. In an embodiment, the process of forming the conductive features 180 and 182 includes etching trenches in the insulating material 114 to define the shape of the local interconnection and to expose at least the top surface of the S/D contact 122 and the top surface of the gate G3. The process further includes depositing one or more conductive materials into the trench. The one or more conductive materials may include conductive barrier layer(s) (such as TiN or TaN) and a metal layer (such as Al, Cu, or W). In this embodiment, the conductive features 180 and 182 are at the same fabrication level.

In another embodiment, the conductive features 180 and 182 may be in the form of interconnection at upper metal layers rather than local interconnection. For example, each of the conductive features 180 and 182 may include one or more vias and one or more metal wires, and the conductive features 180 and 182 may be at the same metal layer or different metal layers.

Although not intended to be limiting, the present disclosure provides many benefits. For example, various designs and layouts of 8T SRAM cell according to the present disclosure provide balanced transistors, especially balanced pull-down transistors, in the write port of the respective SRAM cell. The balanced transistors allow the minimum operation voltage (Vccmin) of the SRAM cells to be reduced, thereby reducing the power consumption thereof. Even though 8T SRAM cells are used as examples, the present disclosure are not limited to 8T SRAM cells, but are applicable to other types of SRAM cells and circuits in general.

In one exemplary aspect, the present disclosure is directed to a semiconductor device. The semiconductor device includes first, second, third, fourth, and fifth active regions arranged in order from first to fifth along a first direction. The first, second, third, and fourth active regions comprise channel regions and source/drain (S/D) regions of first, second, third, and fourth transistors respectively, and the fifth active region comprises channel regions and S/D regions of fifth and sixth transistors. The semiconductor device further includes first, second, third, fourth, fifth, and sixth gates oriented along the first direction. The first through sixth gates are configured to engage the channel regions of the first through sixth transistors respectively. The first and second gates are electrically connected. The third and fourth gates are electrically connected. The semiconductor device further includes one or more first conductive features that electrically connect one of the S/D regions of the first transistor, one of the S/D regions of the second transistor, and the third gate. The semiconductor device further includes one or more second conductive features that electrically connect the second gate, one of the S/D regions of the third transistor, one of the S/D regions of the fourth transistor, and the fifth gate.

In an embodiment of the semiconductor device, each of the first through fifth active regions comprises a fin, and each of the first through sixth transistors is a FinFET. In an embodiment of the semiconductor device, the first and fourth transistors are of a first conductivity type, the second and third transistors are of a second conductivity type opposite to the first conductivity type, and the fifth and sixth transistors are of a same conductivity type.

In an embodiment of the semiconductor device, the first active region further comprises a channel region and S/D regions of a seventh transistor, and the fourth active region further comprises a channel region and S/D regions of an eighth transistor. In a further embodiment, the semiconductor device includes seventh and eighth gates, wherein the seventh and eighth gates are configured to engage the channel regions of the seventh and eighth transistors respectively.

In an embodiment of the semiconductor device, the one or more second conductive features comprise an S/D contact feature disposed over the S/D region of the fourth transistor; and a butted contact connecting the S/D contact feature to the fifth gate. In a further embodiment, the S/D contact feature is also disposed over the S/D region of the third transistor. In an embodiment of the semiconductor device, the one or more second conductive features comprise an S/D contact feature disposed over the S/D region of the fourth transistor; and a conductive feature electrically connecting the S/D contact feature to at least a lower portion of the fifth gate.

In an embodiment of the semiconductor device, the one or more second conductive features comprise an S/D contact feature disposed over the S/D region of the fourth transistor; a first plug disposed over the S/D contact feature; a second plug disposed over the fifth gate; and a conductive wire connecting the first and second plugs.

In an embodiment of the semiconductor device, the first, second, and sixth gates are arranged along a straight line, and the third, fourth, and fifth gates are arranged along another straight line.

In an embodiment of the semiconductor device, the first, second, and fifth gates are arranged along a straight line, and the third, fourth, and sixth gates are arranged along another straight line.

In another exemplary aspect, the present disclosure is directed to a semiconductor device. The semiconductor device includes first, second, third, fourth, and fifth semiconductor fins oriented lengthwise along a first direction and arranged in order from first to fifth along a second direction perpendicular to the first direction. The first, second, third, and fourth semiconductor fins comprise channel regions of first, second, third, and fourth FinFET transistors respectively, and the fifth semiconductor fin comprises channel regions of fifth and sixth FinFET transistors. The semiconductor device further includes first, second, third, fourth, fifth, and sixth gate stacks oriented along the second direction, wherein the first through sixth gate stacks are disposed over the channel regions of the first through sixth transistors respectively. The semiconductor device further includes a first plurality of conductive features that electrically connect a source/drain (S/D) region of the first transistor, a S/D region of the second transistor, and the third gate stack. The semiconductor device further includes a second plurality of conductive features that electrically connect the second gate stack, a S/D region of the third transistor, a S/D region of the fourth transistor, and the fifth gate stack. In the semiconductor device, the first and second gate stacks are electrically coupled, the third and fourth gate stacks are electrically coupled, the first and second FinFETs are of opposite conductivity types, the third and fourth FinFETs are of opposite conductivity types, and the fifth and sixth FinFETs are of a same conductivity type.

In an embodiment of the semiconductor device, the second plurality of conductive features include a shared contact disposed over the S/D region of the third FinFET, the S/D region of the fourth FinFET, and the fifth gate stack. In a further embodiment, the shared contact is disposed over a top surface of the fifth gate stack. In a further embodiment, the shared contact is disposed over a side and conductive portion of the fifth gate stack.

In an embodiment of the semiconductor device the second plurality of conductive features include a contact feature disposed over the S/D region of the fourth FinFET; a first via disposed over the contact feature; and a second via disposed over the fifth gate stack, wherein the first and second vias are electrically connected.

In another exemplary aspect, the present disclosure is directed to a semiconductor device. The semiconductor device includes first, second, third, and fourth transistors arranged in order from first to fourth along a first direction. The first and fourth transistors are NMOS FET. The second and third transistors are PMOS FET. Each of the first through fourth transistors comprises a channel region, two source/drain (S/D) regions, and a gate stack over the respective channel region. The semiconductor device further includes fifth and sixth transistors between the second and third transistors. The fifth and sixth transistors are of a same conductivity type. Each of the fifth and sixth transistors comprises a channel region, two source/drain (S/D) regions, and a gate stack over the respective channel region. The gate stacks of the first, second, and fifth transistors, one of the S/D regions of the third transistor, and one of the S/D regions of the fourth transistor are electrically connected. The gate stacks of the third and fourth transistors, one of the S/D regions of the first transistor, and one of the S/D regions of the second transistor are electrically connected.

In an embodiment of the semiconductor device, the fifth and sixth transistors are PMOS FETs. In another embodiment of the semiconductor device, the fifth and sixth transistors are NMOS FETs. In yet another embodiment of the semiconductor device the first through sixth transistors are FinFETs.

In another exemplary aspect, the present disclosure is directed to a semiconductor device. The semiconductor device includes first, second, third, and fourth active regions arranged in order from first to fourth along a first direction, wherein the first, second, third, and fourth active regions comprise channel regions and source/drain (S/D) regions of first, second, third, and fourth transistors respectively. The first and fourth transistors are of a first conductivity type, and the second and third transistors are of a second conductivity type opposite the first conductivity type. The semiconductor device further includes a fifth active region between the second and third active regions, wherein the fifth active region comprises channel regions and S/D regions of fifth and sixth transistors that are of same conductivity type. The semiconductor device further includes first, second, third, fourth, fifth, and sixth gates, wherein the first through sixth gates are disposed over the channel regions of the first through sixth transistors respectively, wherein the first, second, and fifth gates are electrically connected, and the third and fourth gates are electrically connected. The semiconductor device further includes one or more first conductive features that electrically connect one of the S/D regions of the first transistor, one of the S/D regions of the second transistor, and the third gate. The semiconductor device further includes one or more second conductive features that electrically connect the fifth gate, one of the S/D regions of the third transistor, and one of the S/D regions of the fourth transistor.

In an embodiment of the semiconductor device, the one or more first conductive features include a contact feature disposed over the one of the S/D regions of the second transistor and a local interconnect disposed directly over the contact feature and the fifth gate. In an embodiment of the semiconductor device, the one or more first conductive features include a conductive feature that is disposed over and insulated from one of the S/D regions of the fifth and sixth transistors. In an embodiment of the semiconductor device, the first, second, and fifth gate share a common metal layer.

In an embodiment of the semiconductor device, the first active region further comprises a channel region and S/D regions of a seventh transistor, and the fourth active region further comprises a channel region and S/D regions of an eighth transistor. In a further embodiment, the semiconductor device further includes seventh and eighth gates, wherein the seventh and eighth gates are disposed over the channel regions of the seventh and eighth transistors respectively.

In an embodiment of the semiconductor device, each of the first through sixth transistors are FinFETs. In an embodiment of the semiconductor device, the fifth and sixth transistors share a common S/D region. In an embodiment of the semiconductor device, the fifth and sixth transistors are of the first conductivity type. In another embodiment of the semiconductor device, the fifth and sixth transistors are of the second conductivity type.

In another exemplary aspect, the present disclosure is directed to a semiconductor device. The semiconductor device includes first, second, third, and fourth FinFETs arranged in order from first to fourth along a first direction. The first and fourth transistors are of a first conductivity type, the second and third transistors are of a second conductivity type opposite the first conductivity type, and each of the first through fourth transistors comprises a channel region, two source/drain (S/D) regions, and a gate stack over the respective channel region. The semiconductor device further includes fifth and sixth FinFETs between the second and third FinFETs. The fifth and sixth FinFETs are of a same conductivity type, and each of the fifth and sixth transistors comprises a channel region, two source/drain (S/D) regions, and a gate stack over the respective channel region. In the semiconductor device, the gate stacks of the first, second, and fifth FinFETs, one of the S/D regions of the third FinFET, and one of the S/D regions of the fourth FinFET are electrically connected; the gate stacks of the third and fourth FinFETs, one of the S/D regions of the first FinFET, and one of the S/D regions of the second FinFET are electrically connected; and the fifth and sixth FinFETs share a common S/D region.

In an embodiment of the semiconductor device, the first conductivity type is n-type and the second conductivity type is p-type. In an embodiment of the semiconductor device, the fifth and sixth FinFETs are of the first conductivity type. In another embodiment of the semiconductor device, the fifth and sixth FinFETs are of the second conductivity type. In an embodiment of the semiconductor device, the channel regions of the fifth and sixth FinFETs are in a same fin. In an embodiment of the semiconductor device, the gate stacks of the first, second, and fifth FinFETs share a common metal layer.

In another exemplary aspect, the present disclosure is directed to a semiconductor device. The semiconductor device includes first, second, third, fourth, fifth, and sixth transistors. The first and fourth transistors are NMOS FET, the second and third transistors are PMOS FET, and the fifth and sixth transistors are of a same conductivity type. Each of the first through sixth transistors comprises a channel region, two source/drain (S/D) regions, and a gate stack over the respective channel region. In the semiconductor device, the channel regions of the first through fifth transistors are arranged in order from first to fifth along a first direction; the gate stacks of the first, second, and fifth transistors, one of the S/D regions of the third transistor, and one of the S/D regions of the fourth transistor are electrically connected; and the gate stacks of the third and fourth transistors, one of the S/D regions of the first transistor, and one of the S/D regions of the second transistor are electrically connected.

In an embodiment of the semiconductor device, the channel regions of the fifth and sixth transistors are aligned along a second direction perpendicular to the first direction. In an embodiment of the semiconductor device, the fifth and sixth transistors are PMOS FETs. In an embodiment of the semiconductor device, the first through sixth transistors are FinFETs.

The foregoing outlines features of several embodiments so that those having ordinary skill in the art may better understand the aspects of the present disclosure. Those having ordinary skill in the art should appreciate that they may readily use the present disclosure as a basis for designing or modifying other processes and structures for carrying out the same purposes and/or achieving the same advantages of the embodiments introduced herein. Those having ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   first, second, third, and fourth active regions arranged in order from first to fourth along a first direction, wherein the first, second, third, and fourth active regions comprise channel regions and source/drain (S/D) regions of first, second, third, and fourth transistors respectively, the first and fourth transistors are of a first conductivity type, and the second and third transistors are of a second conductivity type opposite the first conductivity type;
   a fifth active region between the second and third active regions, wherein the fifth active region comprises channel regions and S/D regions of fifth and sixth transistors that are of same conductivity type;
   first, second, third, fourth, fifth, and sixth gates, wherein the first through sixth gates are disposed over the channel regions of the first through sixth transistors respectively, wherein the first, second, and fifth gates are electrically connected, and the third and fourth gates are electrically connected;
   one or more first conductive features that electrically connect one of the S/D regions of the first transistor, one of the S/D regions of the second transistor, and the third gate; and
   one or more second conductive features that electrically connect the fifth gate, one of the S/D regions of the third transistor, and one of the S/D regions of the fourth transistor.

2. The semiconductor device of claim 1, wherein the one or more first conductive features include:
   a contact feature disposed over the one of the S/D regions of the second transistor; and a local interconnect disposed directly over the contact feature and the fifth gate.

3. The semiconductor device of claim 1, wherein the one or more first conductive features include a conductive feature that is disposed over and insulated from one of the S/D regions of the fifth and sixth transistors.

4. The semiconductor device of claim 1, wherein the first, second, and fifth gate share a common metal layer.

5. The semiconductor device of claim 1, wherein the first active region further comprises a channel region and S/D regions of a seventh transistor, and the fourth active region further comprises a channel region and S/D regions of an eighth transistor.

6. The semiconductor device of claim 5, further comprising seventh and eighth gates, wherein the seventh and eighth gates are disposed over the channel regions of the seventh and eighth transistors respectively.

7. The semiconductor device of claim 1, wherein each of the first through sixth transistors are FinFETs.

8. The semiconductor device of claim 1, wherein the fifth and sixth transistors share a common S/D region.

9. The semiconductor device of claim 1, wherein the fifth and sixth transistors are of the first conductivity type.

10. The semiconductor device of claim 1, wherein the fifth and sixth transistors are of the second conductivity type.

11. A semiconductor device, comprising:
first, second, third, and fourth transistors arranged in order from first to fourth along a first direction, wherein the first and fourth transistors are NMOS FET, the second and third transistors are PMOS FET, and each of the first through fourth transistors comprises a channel region, two source/drain (S/D) regions, and a gate stack over the respective channel region; and
fifth and sixth transistors between the second and third transistors, wherein the fifth and sixth transistors are of a same conductivity type, and each of the fifth and sixth transistors comprises a channel region, two source/drain (S/D) regions, and a gate stack over the respective channel region,
wherein the gate stacks of the first, second, and fifth transistors, one of the S/D regions of the third transistor, and one of the S/D regions of the fourth transistor are electrically connected, and
wherein the gate stacks of the third and fourth transistors, one of the S/D regions of the first transistor, and one of the S/D regions of the second transistor are electrically connected.

12. The semiconductor device of claim 11, wherein the fifth and sixth transistors are PMOS FETs.

13. The semiconductor device of claim 11, wherein the fifth and sixth transistors are NMOS FETs.

14. The semiconductor device of claim 11, wherein the first through sixth transistors are FinFETs.

15. A semiconductor device, comprising:
first, second, third, and fourth FinFETs arranged in order from first to fourth along a first direction, wherein the first and fourth transistors are of a first conductivity type, the second and third transistors are of a second conductivity type opposite the first conductivity type, and each of the first through fourth transistors comprises a channel region, two source/drain (S/D) regions, and a gate stack over the respective channel region; and
fifth and sixth FinFETs between the second and third FinFETs, wherein the fifth and sixth FinFETs are of a same conductivity type, and each of the fifth and sixth transistors comprises a channel region, two source/drain (S/D) regions, and a gate stack over the respective channel region,
wherein the gate stacks of the first, second, and fifth FinFETs, one of the S/D regions of the third FinFET, and one of the S/D regions of the fourth FinFET are electrically connected,
wherein the gate stacks of the third and fourth FinFETs, one of the S/D regions of the first FinFET, and one of the S/D regions of the second FinFET are electrically connected, and
wherein the fifth and sixth FinFETs share a common S/D region.

16. The semiconductor device of claim 15, wherein the first conductivity type is n-type and the second conductivity type is p-type.

17. The semiconductor device of claim 15, wherein the fifth and sixth FinFETs are of the first conductivity type.

18. The semiconductor device of claim 15, wherein the fifth and sixth FinFETs are of the second conductivity type.

19. The semiconductor device of claim 15, wherein the channel regions of the fifth and sixth FinFETs are in a same fin.

20. The semiconductor device of claim 15, wherein the gate stacks of the first, second, and fifth FinFETs share a common metal layer.

* * * * *